United States Patent
Goedicke et al.

(10) Patent No.: US 6,315,877 B1
(45) Date of Patent: Nov. 13, 2001

(54) DEVICE FOR APPLYING LAYERS OF HARD MATERIAL BY DUSTING

(75) Inventors: Klaus Goedicke; Fred Fietzke, both of Dresden (DE)

(73) Assignee: Fraunhofer-Gesellschaft zur Foerdering der Angewandten Forschung e.V., Munich (DE)

(*) Notice: Subject to any disclaimer, the term of this patent is extended or adjusted under 35 U.S.C. 154(b) by 0 days.

(21) Appl. No.: 09/485,713

(22) PCT Filed: Aug. 12, 1998

(86) PCT No.: PCT/DE98/02376

§ 371 Date: Mar. 1, 2000

§ 102(e) Date: Mar. 1, 2000

(87) PCT Pub. No.: WO99/11837

PCT Pub. Date: Mar. 11, 1999

(30) Foreign Application Priority Data

Sep. 2, 1997 (DE) ................................ 197 38 234

(51) Int. Cl.⁷ .................................................. C23C 14/34
(52) U.S. Cl. ................ 204/298.09; 204/298.07; 204/298.11; 204/298.26; 204/298.27; 204/298.28
(58) Field of Search .............. 207/298.07, 298.09, 207/298.11, 298.26, 298.27, 298.28, 298.08

(56) References Cited

U.S. PATENT DOCUMENTS

| | | | |
|---|---|---|---|
| 3,747,559 | * 7/1973 | Dietze | 118/725 |
| 4,022,939 | 5/1977 | Roth | 427/251 |
| 4,051,010 | * 9/1977 | Roth et al. | 204/298.11 |
| 4,062,319 | 12/1977 | Roth et al. | 118/733 |
| 4,169,913 | 10/1979 | Kobayashi et al. | 428/217 |
| 4,647,361 | * 3/1987 | Bauer | 204/298.09 |
| 5,135,629 | * 8/1992 | Sawada et al. | 204/192.12 |
| 5,690,796 | * 11/1997 | Dupont et al. | 204/192.16 |
| 6,090,247 | * 7/2000 | White et al. | 204/298.26 |

FOREIGN PATENT DOCUMENTS

| | | |
|---|---|---|
| 2448023 | 6/1975 | (DE). |
| 2656723 | 7/1977 | (DE). |
| 2815704 | 10/1979 | (DE). |
| 29510545 | 10/1995 | (DE). |
| 0503822 | 9/1992 | (EP). |
| 2160898 | * 5/1985 | (GB). |
| 4-45265 | * 2/1992 | (JP). |
| 5-148633 | * 6/1993 | (JP) ................. 204/298.03 |

OTHER PUBLICATIONS

Patent abstracts of Japan, vol. 16, No. 228 (C–0944) published May 27, 1992 of JP 04 045265.
Sue et al., "Friction and Wear Properties of Titanium Nitride Coatings in Sliding Contact with AISI 01 Steel," *Surface and Coatings Technology* 43/44, pp. 709–720 (1990).

* cited by examiner

*Primary Examiner*—Rodney G. McDonald
(74) *Attorney, Agent, or Firm*—Greenblum & Bernstein, P.L.C.

(57) ABSTRACT

A device for the sputter application of hard material coatings, including an exhaustible vacuum chamber, at least one sputtering source for depositing a coating material, a plurality of fixtures for supporting a plurality parts to be coated, the fixtures being mounted on planet gears which are movable via a planetary drive, a centrally disposed heating device, a reactive gas inlet, and a plurality of movable screens for covering the at least one sputtering source, the screens being arranged to surround the fixtures, wherein the heating device, the screens, and the planetary drive comprise an assembly which is removable from the vacuum chamber.

36 Claims, 3 Drawing Sheets

DEVICE FOR APPLYING LAYERS OF HARD MATERIAL BY DUSTING

CROSS-REFERENCE TO RELATED APPLICATIONS

The present application is a U.S. National Stage Application of International Application No. PCT/DE98/02376, filed on Aug. 12, 1998, and claims priority under 35 U.S.C. §119 of German Application No. 197 38 234.7, filed on Sep. 2, 1997.

BACKGROUND OF THE INVENTION

1. Field of the Invention

The invention concerns a device for the sputter application of hard material coatings at high temperatures. A preferred area of application is the coating with hard material of forming tools and Cutting tools by high-rate sputtering using magnetrons. More particularly, the invention concerns devices for coating temperatures of 400° C. to 800° C.

2. Description of Background and Relevant Information

It is generally known to coat workpieces, especially tools for the cutting of metals, and forming tools with hard, wear-resistant, protective coatings by means of physical vapor deposition (PVD). The most frequently employed PVD processes for these applications are vacuum arc evaporation and magnetron sputtering. Coatings of titanium nitride continue to enjoy the most widespread use (Sue, J. A.; Troue, H. H.; Friction and wear properties of titanium nitride coating in sliding contact with AISI 01 steel; Surf. Coat. Technol. no. 43/44 (1990) p. 709–720).

In addition, a large number of other coatings, such as nitrides, carbides, carbonitrides, and oxynitrides of the metals chromium, niobium, zirconium, titanium, etc., are known as hard material coatings (DE 295 10 545; U.S. Pat. No. 4,169,913).

Moreover, extensive efforts are underway to use diamond-like carbon layers to achieve hard and wear-resistant coatings on workpieces (EP 0 503 822).

All these coatings applied by means of PVD are deposited at comparatively low temperatures, i.e., in the range between room temperature and approximately 400° C.

Known PVD devices, as they are used for coating by means of sputtering sources, have one or more magnetron sources for the coating material. The workpieces to be coated are held in fixtures, and rotate about one or more axes during the coating process. Adequate uniformity of the coating is ensured in this manner. The largest number of workpieces per coating process and the greatest uniformity of coating thickness are achieved when the workpieces are arranged on a rotating device in fixtures that are part of planetary drives and thus rotate about the primary axis of the planetary drive and also about their own axes. For economic reasons, the diameter of these fixtures is chosen to be as large as possible. Consequently, their diameter is approximately 30 to 40 percent of the diameter of the rotating device.

Arranged on the circumference of such PVD devices, outside the region of the rotating fixtures, are laminar heating devices. They customarily consist of heating elements that are embedded in stainless steel tubes and are electrically insulated therefrom. In order to ensure workpiece temperatures of 400° C. during coating, surface temperatures of the heating devices of at least 600 to 700° C. are necessary, and a noticeable portion, as a rule, 20 to 30 percent, of the circumference of the rotating device must be enclosed by the heating device. In this situation, it is unavoidable that a large portion of the heat output reaches the walls of the vacuum chamber. For this reason, the walls are equipped with water cooling. After the coating process is completed, the vacuum chamber is ventilated. The coated workpieces are removed from their fixtures and other workpieces to be coated are inserted. During this process, the rotating device can be disconnected from the drive elements and removed from the vacuum chamber as a unit. The heating devices always remain in the vacuum chamber. The shortest changeover times are achieved when a second rotating device filled with workpieces stands ready and is loaded into the vacuum chamber.

The disadvantages of such devices arc that the power density of the heating elements cannot be increased sufficiently for a workpiece temperature of 800° C. to be reached. In other words, they cannot be used at temperatures above approximately 500° C. Furthermore, even in the temperature ranges up to 500° C., the temperature differences among the workpieces as well as within each individual workpiece increase with increasing temperature. At the same time, the temperature of the individual workpiece is subject to large variations over time. Thus, supercritical internal stresses arise in the deposited coatings, which lead to flaking of the coatings.

The fact that the fixtures, the rotating device, the heating devices, and all internal surfaces of the vacuum chamber are coated as well the workpieces, leads to the further major disadvantage that coating particles are released from these surfaces. These coating particles, known as flakes, some of which are electrically charged, lead to substantial problems since they adversely affect the quality of hard material coatings deposited by sputtering to such a degree that the service life of workpieces coated in this manner is very short.

Lastly, the heat output available to heat the workpieces is reduced by the layers precipitating on the heating devices, and the heat losses toward the walls of the vacuum chamber take on unacceptably high values. Cleaning of the device, especially of the heating devices, involves difficulties.

SUMMARY OF THE INVENTION

The invention therefore provides a device for the sputter application of hard material coatings at high temperatures of up to 800° C. Using the device, it should be possible to coat parts, especially workpieces, such that large temperature gradients do not arise either between parts or within the individual parts, in order to be able to deposit high-quality coatings by sputtering. The intent is to prevent internal stresses within the coating and to minimize the number of defects. Furthermore, the device is intended to limit the generation of interfering particles, especially flakes. The device is also intended to facilitate the pretreatment required for the overall process of sputter application. The times for loading and unloading of parts should be short in order to increase productivity. The cost of cleaning the device should also be reduced.

The invention provides for a device for the sputter application of hard material coatings, consisting of an exhaustible vacuum chamber, at least one sputtering source with at least one target of sputtering material or the components thereof, a mechanism with several parts to be coated mounted in fixtures on planet gears that are movable by means of a planetary drive, a heating device, a reactive gas inlet, and movable screens to cover the sputtering sources, characterized in that the fixtures are surrounded by coaxially arranged screens, in that the heating device is arranged in the center of the planetary drive, in that the heating device, the screens and the planetary drive constitute an assembly that can be replaced to load and unload the parts, in that the screens have openings in the region of the outlet areas of the particles deposited by the sputtering sources, in that the screens are radially movable independently of one another such that they cover individual or all sputtering sources, in that shield plates that close off the sputtering region are arranged to be stationary above and below the parts to be coated, in that the diameter of the pitch circle of the planet wheels is at least ¾ of the diameter of the base plate, and in that the fixtures are arranged to be electrically insulated.

The device may be characterized in that the heating device consists of a carbon tube through which current passes. The device may be characterized in that the tube is structured by parting lines, preferably in a meander pattern. The device may be characterized in that the inner screen and the inner shield plates are made of a material with high roughness on their inner sides. The device may be characterized in that at least the outer screen and the outer shield plate have a highly reflective surface. The device may be characterized in that circuit elements are arranged to apply different potentials to the sputtering sources and the fixtures.

The device according to the invention utilizes of an exhaustible vacuum chamber, inside which is located a replaceable base plate. The base plate is considered to be any design that is appropriate for an assembly base. Coaxial screens are arranged on this base plate. These screens have openings that correspond to the outlet areas of sputtering sources arranged on the circumference of the vacuum chamber. Arranged centrally inside the screens is a heating device, which is surrounded by fixtures to accommodate parts to be coated. The fixtures are arranged on planet wheels of a planetary drive and execute a planetary motion in the known manner. The axes of the planet wheels are located on a pitch circle with a diameter of at least ¾ of the diameter of the base plate. Fixed shield plates are arranged above and below the heating device.

The design of the heating device according to the invention, and its central position inside the screens and shield plates, ensure complete utilization of the heat output for heating of the parts. The rotational symmetry for the emission of heat achieved thereby, together with the rule for proportioning the fixtures, leads to a reduction in temperature gradients as compared to conventional devices. The arrangement of fixtures using heat transmission barriers, preferably as ceramic thermal isolators, leads to a further minimization of heat losses. The advantages of the arrangement and design of the heating device are the uniformly high surface temperature, a high heating power density, a high radiation coefficient, stable operation even under conditions of continuous coating, avoidance of flake formation, and good suitability for cleaning processes.

According to the invention, the screens are radially movable relative to one another and to the base plate. These screens are designed such that, in certain positions relative to one another, they permit the execution of various process steps under improved conditions.

For the "heating" process step, the heating device and the fixtures are almost fully enclosed due to the appropriate setting of the screens. In this way, a minimization of heat losses resulting from heat dissipation through the walls of the vacuum chamber is achieved.

In another position of the screens, a "pretreatment" of the parts in a dense, magnetic field-intensified plasma is possible. To this end, the screens are moved such that the openings in the screens expose appropriate pretreatment devices for the parts.

For the "coating" process step, the screens can be positioned such that openings in the screens now expose the sputtering sources for coating of the parts. The fixtures are arranged so as to be electrically insulated and can be connected to different electric potentials depending on the relevant process step.

The further advantages of the screens are that coating of the inner surfaces of the vacuum chamber is prevented and the temperature of the screens and shield plates during the coating process assumes values such that they themselves do not constitute a source of flakes.

Moreover, the screens and shield plates are designed such that the vacuum pumps have adequate pumping capacity even in the interior of the device.

To replace the parts, the base plate can be removed from the vacuum chamber along with the heating device, the fixtures, the screens, and the shield plates as an integrated assembly. This makes it possible to clean the screens, the shield plates, and, if necessary, the heating device, by mechanical treatment, for example, by sandblasting.

A further advantage of the replaceable base plate is that, after the sputter application process, it and the coated parts can be replaced by a different base plate with parts to be coated. In this way, a cleaning process can be performed in parallel with the next sputter application process. This increases the effectiveness of the device.

Advantageous embodiments of the device are achieved in that the heating device, through which the current passes directly, is manufactured to be rotationally symmetrical and from graphite or carbon fiber composite materials. One low-cost embodiment uses a graphite tube. The latter is structured to increase the uniformity of heat radiation and to adapt to the power supply device using appropriately dimensioned parting lines. It is most advantageous for the parting lines to be introduced in a meander pattern. Mechanical methods are used to introduce the parting lines into the graphite tube. As an advantageous embodiment, it is possible to arrange the parts to be coated in several layers above one another on each fixture as a function of the size of the parts to be coated. The productivity of the device is further increased as a result. It is also advantageous to manufacture the screens and shield plates of heat resistant materials such as stainless steel, titanium, or molybdenum. The inner shield plate and the inner screen are preferably provided with very high surface roughness. It is also useful to provide the surface with rough, sharply formed sheathing, for example, mesh-type sheathing. In this way, the production of flakes is further reduced. The outer shield plates and the outer screens, in contrast, have very smooth, highly reflective surfaces.

The screens are provided with separate motor drives to move them. Embodiments for the screen drive that have only mechanical connecting elements inside the vacuum chamber are especially advantageous. The motor is located outside the vacuum chamber.

Due to the insulated arrangement of the fixtures, it is possible to apply different potentials using known circuit elements depending on the process to be performed.

In this way, the sputtering sources are used for the "pretreatment" process step as well as for the "coating" process step. The use of the sputtering sources for plasma pretreatment achieves a concentration and intensification of the plasma. This increases the effectiveness of this process step and reduces the pretreatment time.

According to one aspect of the invention, there is provided a device for the sputter application of hard material coatings, comprising an exhaustible vacuum chamber, at least one sputtering source for depositing a coating material, a plurality of fixtures for supporting a plurality parts to be coated, the fixtures being mounted on planet gears which are movable via a planetary drive, a heating device arranged in a center of the planetary drive, a reactive gas inlet, and a plurality of movable screens positioned to cover the at least one sputtering source and positioned to surround the plurality of fixtures, wherein the heating device, the screens, and the planetary drive comprise an assembly which is removable from the vacuum chamber and is provided to load parts to be coated. The screens may be coaxially arranged with respect to one of the heating device and a planetary drive axis. The assembly may comprise a base plate with rollers and wherein the screens are radially moveably mounted to the base plate. The assembly may further comprise a base plate for supporting the fixtures. The screens may be adapted to move radially with respect to one another so as to provide openings for allowing the at least one sputtering source to coat the plurality of parts on the fixtures. The screens may be independently radially moveable.

The device may further comprise stationary shield plates arranged to close off a sputtering region. The shield plates are disposed in one of above and below the parts. The at least one sputtering source may comprise a target of one of a sputtering material and components of a sputtering material. At least one of the screens may be adapted to cover the at least one sputtering source. The shield plates may be arranged to be stationary transverse to a main axis of the planetary drive.

The device may further comprise a base plate for supporting the fixtures wherein the base plate comprises a diameter. The fixtures may be rotatable via planet wheels having a pitch circle diameter which is at least ¾ of the diameter of the base plate. The fixtures may be arranged to be electrically insulated. The heating device may comprise a carbon tube through which current passes. The carbon tube may be structured by parting lines. The parting lines may be arranged in a meander pattern. At least one of the screens may have an inner side which is made of a material with high roughness. At least one of the screen may comprise an inner screen.

The device may further comprise at least one shield plate having an inner side which is made of a material with high roughness. The at least one of the screen may comprise an outer screen having a highly reflective surface. The device may further comprise at least one shield plate have a highly reflective surface. The at least one shield plate may comprise an outer shield plate. The device may further comprise at least one circuit element arranged to apply different potentials to one of the at least one sputtering source and the fixtures. The at least one sputtering source may comprise a double magnetron. The at least one sputtering source may comprise three double magnetrons arranged to surround the fixtures.

The invention also provides for a device for the sputter application of hard material coatings, comprising at least one sputtering source for depositing a coating material, an exhaustible vacuum chamber for enclosing a removable assembly, wherein the removable assembly comprises, a base plate, a plurality of fixtures for supporting a plurality parts to be coated, the fixtures being rotatably mounted on the base plate, a heating device disposed on the base plate, and at least one movable screen mounted on the base plate, the at least one screen being arranged to rotate relative to the base plate. The heating device may be centrally disposed on the base plate and wherein the at least one screen is coaxially arranged with respect to the heating device. The assembly may further comprise a planetary drive adapted to cause the fixtures to rotate. The fixtures may be mounted on planet gears which are movable via the planetary drive. The assembly may further comprise a planetary drive adapted to cause the fixtures to rotate. The device may further comprise at least one shield plate. The at least one sputtering source may comprise a double magnetron. The at least one sputtering source may comprise three double magnetrons arranged to surround the fixtures.

It is also possible to use are evaporators instead of magnetrons as sources for the coating material.

BRIEF DESCRIPTION OF THE DRAWINGS

The invention is explained with reference to an exemplary embodiment. Shown herein are.

DETAILED DESCRIPTION OF THE INVENTION

Figure 1:
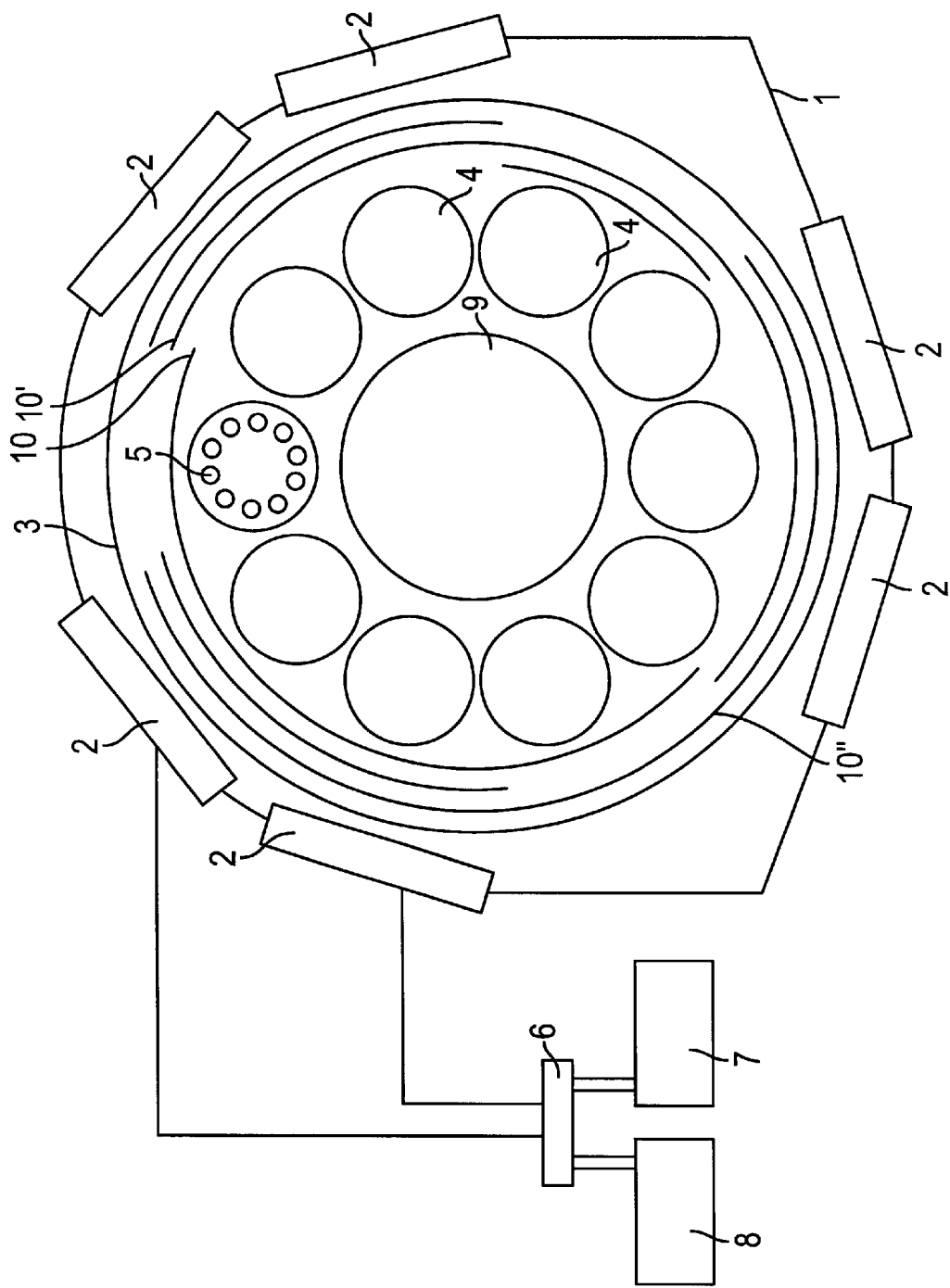
FIG. 1 a cross-section of the device.

In FIG. 1, three double magnetrons 2 are arranged in a vacuum chamber 1 in order to apply electrically insulating oxide layers by reactive pulsed magnetron sputtering. Located in the vacuum chamber 1 is a base plate 3. Beneath the base plate 3 is located a planetary drive with ten planet wheels (not shown). Each planet wheel is connected to a fixture 4. Ten parts 5 to be coated are arranged on each fixture 4 in a known manner. The fixtures 4 are designed such that each part 5 to be coated executes a rotation about its own axis and about the axis of the fixture.

The fixtures 4 are electrically insulated with respect to ground potential. The fixtures 4 are connected by way of a switch 6 to one terminal of a power supply 7 whose other terminal is connected to the double magnetron 2. In this way, a very effective magnetic field intensified plasma process is realized for pretreatment of the parts 5 prior to coating. In another position of the switch 6, the fixtures 4 are grounded and the double magnetron 2 is connected to a sputtering power supply 8, which generates a bipolar pulsed current. The fixtures 4 have a diameter of 150 mm. Their axes are arranged on a pitch circle with a diameter of 525 mm. For a diameter of the base plate 3 of 700 mm, the pitch circle measures ¾ of that diameter.

Located in the center of the base plate 3 is a heating device 9. It utilizes of a carbon fiber composite tube that is slitted in a meander pattern and has a diameter of 350 mm. The heating device 9 reaches surface temperatures of 1100° C.

Screens 10 through 10" are concentrically arranged on the base plate 3. Each of the screens 10 through 10" can be individually controlled by way of a motor outside of the vacuum chamber 1, a rotary/thrust coupling, and a gear drive. The screens 10 through 10" have openings whose size and shape essentially correspond to the outlet areas of the sputtered particles from the double magnetrons 2.

Figure 2:
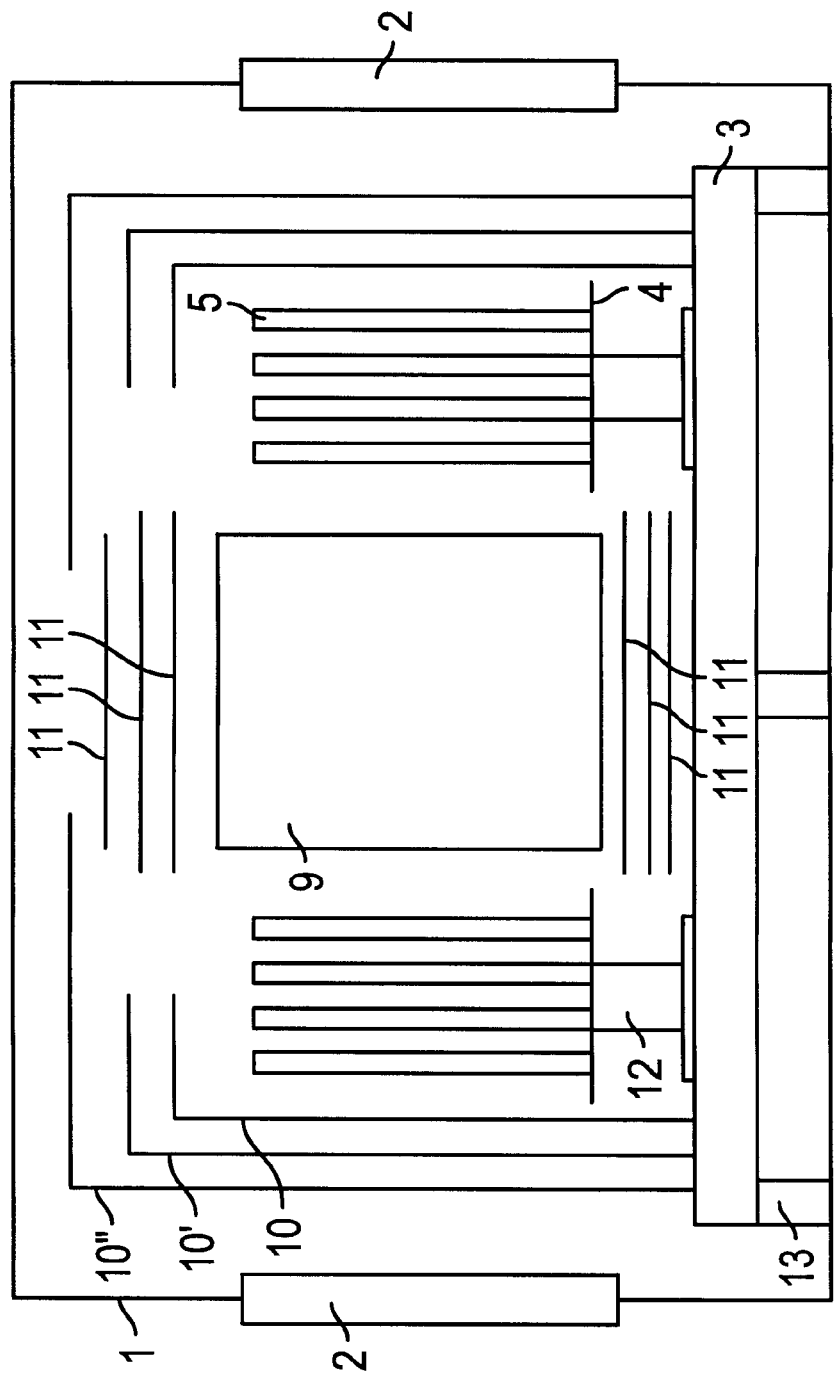
FIG. 2 a longitudinal section.

FIG. 2 likewise shows the vacuum chamber 1 with the double magnetrons 2 arranged on the circumference. Arranged on the base plate 3 are the heating device 9, the fixtures 4, and the screens 10 through 10". Arranged above and below the heating device 9 are fixed disk-shaped shield plates 11. The inner screen 10 and the inner shield plates are made of molybdenum. On their sides facing the heating device 9, they are provided with a mesh-like, perforated covering (not shown). This covering is capable of mechanically binding unused portions of the particles that form the coating. After a specified period of use, the mesh-like perforated covering is replaced. The screens 10', 10" and the outer shield plates are made of stainless steel sheet and are polished oil both sides. This achieves a very high reflection of the heat radiated from all components within the screens 10 through 10". The design of the screens 10 through 10" and shield plates 11 blocks the direct path of sputtered particles to the inner walls of the vacuum chamber 1 but ensures an adequately high pumping capacity of the vacuum pumps of 200 1/sec in the region of the fixtures 4. The fixtures 4 are mechanically connected through the base plate 3 to the planet wheels of the planetary drive, which are not shown. Ceramic thermal isolators 12 are located between the planet wheels and the fixtures 4. By way of rollers 13, the entire base plate 3 can be removed from the opened vacuum chamber 1 on rails (not shown). An identical base plate with parts 5 to be coated is loaded into the vacuum chamber in order to perform the next coating process. During this time, the coated parts 5 are removed from the fixtures 4 of the first base plate 3. To this end, the screens 10 through 10" arc raised. After a cooling phase, the parts 5 are removed. The fixtures 4 and the inner screen 10 are cleaned if necessary. This is followed by reloading.

Figure 3C:
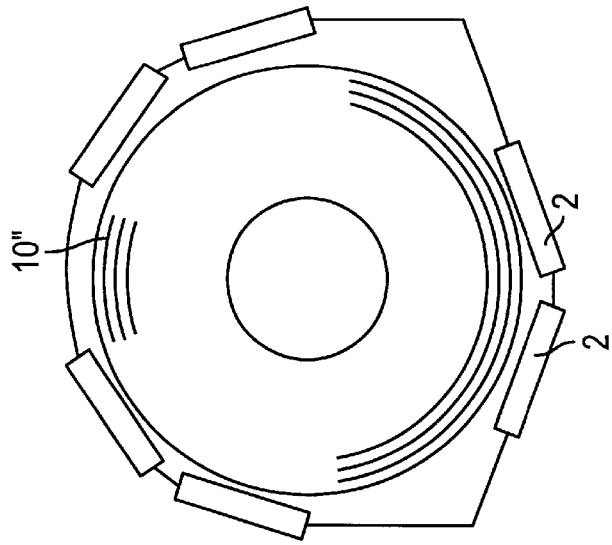
FIGS. 3a–3c the basic function of the screens.
Figure 3B:
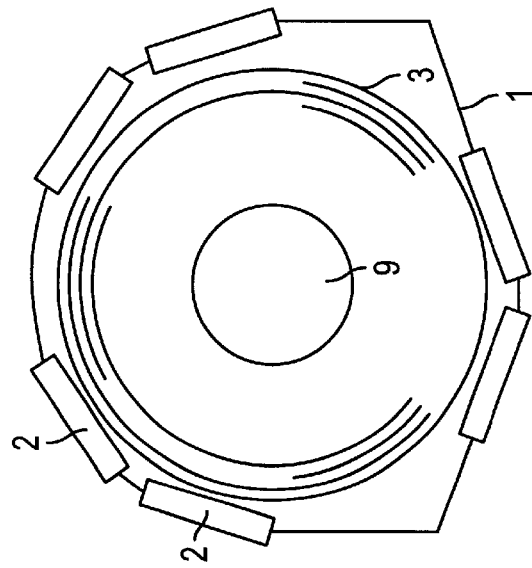
Figure 3A:
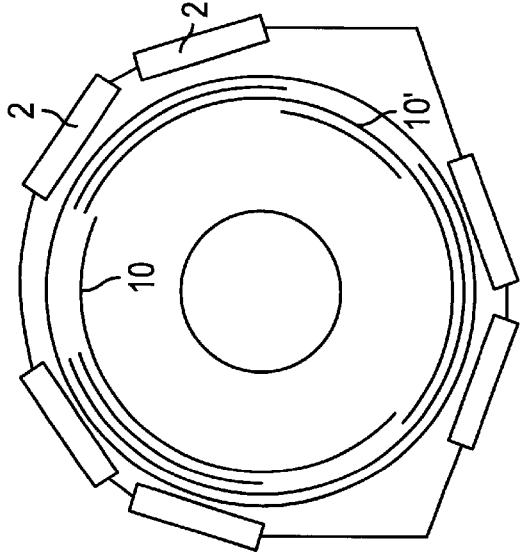

FIG. 3a to 3c show the method of operation of the screens 10 through 10" without the fixtures 4. For the "heating" process step, the screens 10 through 10" are positioned according to FIG. 3a, in which all double magnetrons 2 arc covered with respect to the parts 5. During the "plasma pretreatment" process step, the screens 10 through 10" are positioned according to FIG. 3b. Here, the parts 5 are exposed to a dense magnetic field intensified plasma through the use of a double magnetron 2. During the "coating" process step, the screens 10 through 10" are positioned such that the openings in the screens 10 through 10" expose the outlet areas of two double magnetrons 2 for coating.

What is claimed is:

1. A device for the sputter application of material coatings, comprising:
   an exhaustible vacuum chamber;
   at least one sputtering source for depositing a coating material;
   a plurality of fixtures for supporting a plurality of parts to be coated, the fixtures being mounted on planet gears which are movable via a planetary drive;
   a heating device arranged in a center of the planetary drive;
   a reactive gas inlet; and
   a plurality of movable screens positioned to cover the at least one sputtering source and positioned to surround the plurality of fixtures;
   wherein the heating device, the screens, and the planetary drive comprise an assembly which is removable from the vacuum chamber and is provided to load parts to be coated.

2. The device of claim 1, wherein the screens are coaxially arranged with respect to one of the heating device and a planetary drive axis.

3. The device of claim 2, wherein the assembly comprises a base plate with rollers and wherein the screens are radially moveably mounted to the base plate.

4. The device of claim 2, wherein the assembly further comprises a base plate for supporting the fixtures.

5. The device of claim 4, wherein the screens are adapted to move radially with respect to one another so as to provide openings for allowing the at least one sputtering source to coat the plurality of parts on the fixtures.

6. The device of claim 5, wherein the screens are independently radially moveable.

7. The device of claim 6, further comprising stationary shield plates arranged to close off a sputtering region.

8. The device of claim 7, wherein the shield plates are disposed in one of above and below the parts.

9. The device of claim 8, wherein the at least one sputtering source comprises a target of one of a sputtering material and components of a sputtering material.

10. The device of claim 9, wherein at least one of the screens is adapted to cover the at least one sputtering source.

11. The device of claim 8, wherein the shield plates are arranged to be stationary transverse to a main axis of the planetary drive.

12. The device of claim 1, further comprising a base plate for supporting the fixtures wherein the base plate is circular.

13. The device of claim 12, wherein the fixtures are rotatable via planet wheels having a pitch circle diameter which is at least ¾ of the diameter of the base plate.

14. The device of claim 13, wherein the fixtures are arranged to be electrically insulated.

15. The device of claim 1, wherein the heating device comprises a carbon tube through which current passes.

16. The device of claim 15, wherein the carbon tube is structured by parting lines.

17. The device of claim 16, wherein the parting lines are arranged in a meander pattern.

18. The device of claim 1, wherein at least one of the screens has an inner side which is made of a material with a rough surface.

19. The device of claim 18, wherein at least one of the screens comprises an inner screen.

20. The device of claim 1, further comprising at least one shield plate having an inner side which is made of a material with a rough surface.

21. The device of claim 1, wherein at least one of the screens comprises an outer screen having a reflective surface.

22. The device of claim 21, further comprising at least one shield plate have a reflective surface.

23. The device of claim 22, wherein at least one shield plate comprises an outer shield plate.

24. The device of claim 1, further comprising at least one circuit element arranged to apply different potentials to one of the at least one sputtering source and the fixtures.

25. The device of claim 1, wherein the at least one sputtering source comprises a double magnetron.

26. The device of claim 1, wherein the at least one sputtering source comprises three double magnetrons arranged to surround the fixtures.

27. A device for the sputter application of material coatings, comprising:
   at least one sputtering source for depositing a coating material;
   an exhaustible vacuum chamber for enclosing a removable assembly;
   wherein the removable assembly comprises:
   a base plate;
   a plurality of fixtures for supporting a plurality parts to be coated, the fixtures being rotatably mounted on the base plate;
   a heating device disposed on the base plate; and
   at least one movable screen mounted on the base plate, the at least one screen being arranged to rotate relative to the base plate.

28. The device of claim 27, wherein the heating device is centrally disposed on the base plate and wherein the at least one screen is coaxially arranged with respect to the heating device.

29. The device of claim 28, wherein the assembly further comprises a planetary drive adapted to cause the fixtures to rotate.

30. The device of claim 29, wherein the fixtures are mounted on planet gears which are movable via the planetary drive.

31. The device of claim 28, wherein the assembly further comprises a planetary drive adapted to cause the fixtures to rotate.

32. The device of claim 31, further comprising at least one shield plate.

33. The device of claim 32, wherein the at least one sputtering source comprises a double magnetron.

34. The device of claim 27, wherein the at least one sputtering source comprises three double magnetrons arranged to surround the fixtures.

35. A device for the sputter application of material coatings, comprising:
   an exhaustible vacuum chamber;
   at least one sputtering source for depositing a coating material;
   a plurality of fixtures for supporting a plurality of parts to be coated, the fixtures being mounted on planet gears which are movable via a planetary drive;
   a heating device arranged in a center of the planetary drive;
   a reactive gas inlet; and
   a plurality of movable screens disposed between the at least one sputtering source and the plurality of fixtures;
   wherein the heating device, the screens, and the planetary drive comprise an assembly which is removable from the vacuum chamber and is provided to load parts to be coated.

36. A device for the sputter application of material coatings, comprising:
   at least one sputtering source for depositing a coating material;
   an exhaustible vacuum chamber for enclosing a removable assembly;
   wherein the removable assembly comprises:
      a base plate;
      a plurality of fixtures for supporting a plurality parts to be coated, the fixtures being rotatably mounted on the base plate;
      a heating device disposed on the base plate; and
      at least one screen movably mounted on the base plate, the at least one screen being disposed between the plurality of fixtures and the at least one sputtering source.

* * * * *